United States Patent
Tachibana et al.

(10) Patent No.: US 9,750,166 B2
(45) Date of Patent: Aug. 29, 2017

(54) ELECTRIC POWER CONVERTER

(71) Applicant: DENSO CORPORATION, Kariya, Aichi-pref. (JP)

(72) Inventors: Hideaki Tachibana, Nagoya (JP); Makoto Saizen, Anjo (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 14/612,696

(22) Filed: Feb. 3, 2015

(65) Prior Publication Data

US 2015/0222195 A1 Aug. 6, 2015

(30) Foreign Application Priority Data

Feb. 5, 2014 (JP) .................................. 2014-020492

(51) Int. Cl.
*H02M 7/00* (2006.01)
*H05K 7/20* (2006.01)
(Continued)

(52) U.S. Cl.
CPC ........ *H05K 7/20927* (2013.01); *H02M 7/003* (2013.01); *H05K 5/0217* (2013.01);
(Continued)

(58) Field of Classification Search
CPC ........... H05K 7/20927; H05K 7/20272; H05K 7/20218–7/20263; H05K 7/1432; H02M 7/003; H01L 23/473
(Continued)

(56) References Cited

U.S. PATENT DOCUMENTS

2005/0030717 A1* 2/2005 Inagaki ............... H01L 23/4334
361/699
2006/0284308 A1* 12/2006 Harada ................. H01L 25/072
257/729
(Continued)

FOREIGN PATENT DOCUMENTS

JP 2011-134813 7/2011
JP 2011-200090 10/2011
(Continued)

OTHER PUBLICATIONS

Office Action (3 pgs.) dated Jan. 19, 2016 issued in corresponding Japanese Application No. 2014-020492 with an at least partial English language translation (5 pgs.).

*Primary Examiner* — Zachary M Pape
*Assistant Examiner* — Amir Jalali
(74) *Attorney, Agent, or Firm* — Nixon & Vanderhye P.C.

(57) ABSTRACT

An electric power converter has a semiconductor stacked unit, auxiliary electronic components, a pressing member, and a case for accommodating these components. The case has a front wall in a stacking direction, a rear wall, a pair of side walls, and inner walls. The inner walls include a partition wall that is disposed opposing the front wall, and a support wall that is formed so as to extend toward the rear wall from a rear end surface of the partition wall. A unit accommodation space for accommodating the semiconductor stacked unit and the pressing member is formed between the partition wall and the front wall. Auxiliary accommodation spaces for accommodating the auxiliary electronic components are formed between the partition wall and the rear wall.

11 Claims, 3 Drawing Sheets

(51) Int. Cl.
*H05K 7/14* (2006.01)
*H05K 5/02* (2006.01)
*H01L 23/473* (2006.01)

(52) U.S. Cl.
CPC ....... *H05K 7/1432* (2013.01); *H05K 7/20272* (2013.01); *H01L 23/473* (2013.01)

(58) Field of Classification Search
USPC ............ 361/679.46–679.54, 688–723; 165/80.4–80.5, 104.33; 257/712–714; 174/547–548
See application file for complete search history.

(56) References Cited

U.S. PATENT DOCUMENTS

| | | | |
|---|---|---|---|
| 2009/0241575 A1* | 10/2009 | Jadric | H05K 7/20936 62/259.1 |
| 2010/0321889 A1* | 12/2010 | Yoshino | H05K 7/20927 361/702 |
| 2011/0318884 A1* | 12/2011 | Noritake | H01L 21/565 438/122 |
| 2012/0001341 A1* | 1/2012 | Ide | H01L 23/473 257/773 |
| 2013/0058068 A1* | 3/2013 | Funatsu | H05K 7/20927 361/820 |
| 2013/0058143 A1* | 3/2013 | Tachibana | H02M 7/003 363/131 |
| 2015/0189790 A1* | 7/2015 | Tachibana | H05K 7/20927 361/699 |
| 2015/0382501 A1* | 12/2015 | Horiuchi | H05K 7/20927 363/131 |

FOREIGN PATENT DOCUMENTS

| | | |
|---|---|---|
| JP | 2011-259544 | 12/2011 |
| JP | 2013-055840 | 3/2013 |

* cited by examiner

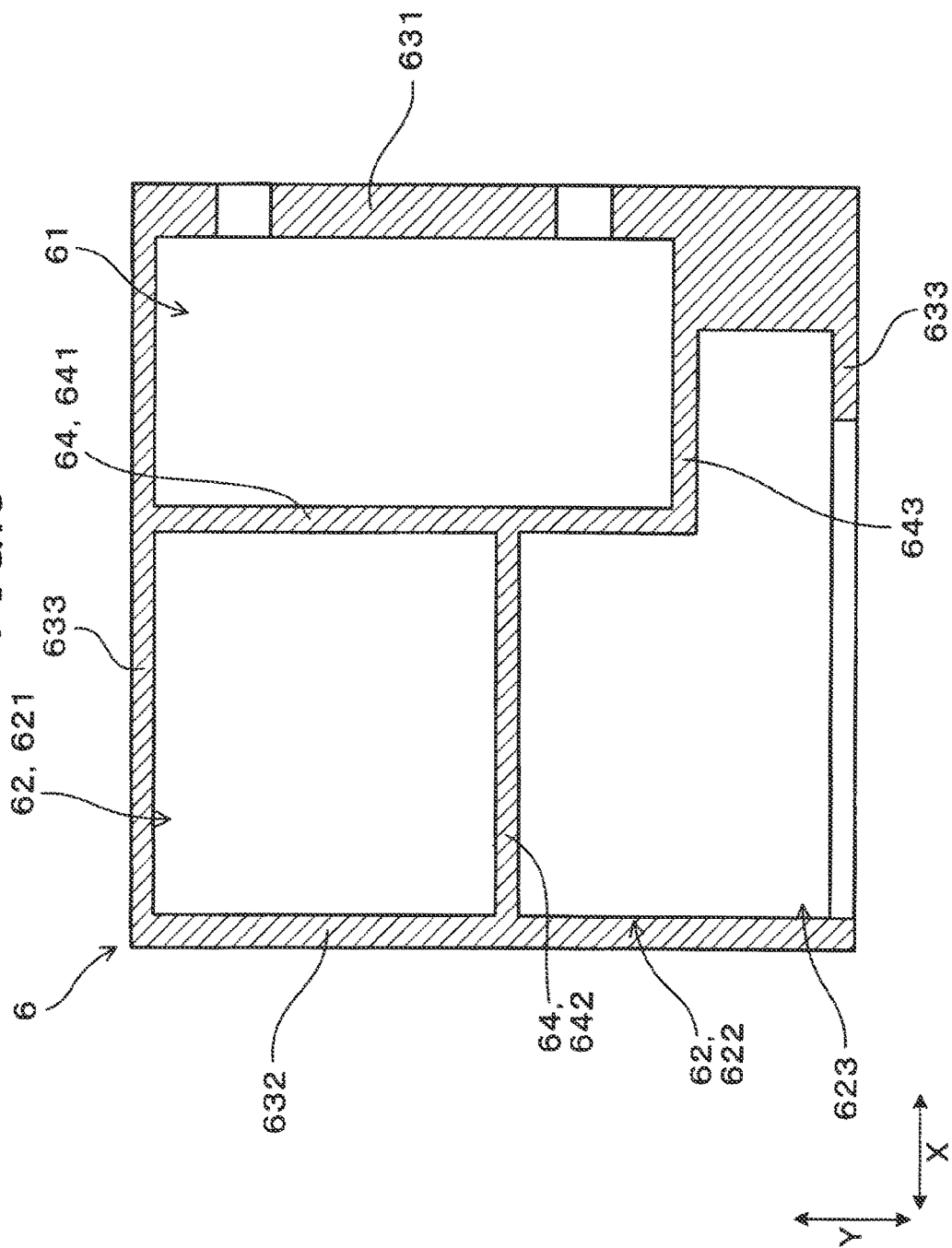

ELECTRIC POWER CONVERTER

CROSS-REFERENCE TO RELATED APPLICATION

This application is based on and claims the benefit of priority from earlier Japanese Patent Application No. 2014-20492 filed Feb. 5, 2014, the description of which is incorporated herein by reference.

TECHNICAL FIELD

The present disclosure relates to an electric power converter.

BACKGROUND

An electric power converter is mounted on vehicles such as a hybrid car and an electric car.

The electric power converter is for converting DC power supplied from a battery equipped in the vehicle to three-phase AC power for driving a drive motor.

As such an electric power converter is disclosed in Japanese Patent Application Laid-Open Publication No. 2013-55840, for example.

The electric power converter disclosed in the Publication '840 is provided with a plurality of semiconductor modules each with a built-in switching element, and a plurality of cooling pipes for cooling the plurality of semiconductor modules.

The plurality of semiconductor modules and the plurality of cooling pipes are stacked alternately to form a semiconductor stacked unit.

The semiconductor stacked unit is accommodated in a case together with a pressing member, and is pressed in a stacking direction thereof by the pressing member.

However, the electric power converter disclosed in the Publication '840 has the following problems.

In the electric power converter of the Publication '840, the semiconductor stacked unit is fixed in the case by the pressing force of the pressing member.

Therefore, it is necessary for the case to have rigidity to withstand the pressure of the pressing member.

Especially in a pair of walls of the case disposed in the stacking direction of the semiconductor stacked unit, since the pressure is applied intersecting perpendicularly to the pair of walls, the walls must be thickened to greatly raise the rigidity.

Thus, the weight, the cost, and the external size of the case increase, which leads to increase the weight, the cost, and the external size of the electric power converter.

SUMMARY

An embodiment provides an electric power converter capable of reducing weight, size and cost.

In an electric power converter according to a first aspect, the electric power converter includes a semiconductor stacked unit formed by stacking alternately a plurality of semiconductor modules with built-in semiconductor element therein and a plurality of cooling pipes for cooling the plurality of semiconductor module.

The electric power converter further includes auxiliary electronic components that form a power conversion circuit together with the semiconductor modules, a pressing member that presses the semiconductor stacked unit in a stacking direction, and a case that accommodates the semiconductor stacked unit, the auxiliary electronic components and the pressing member.

The case includes a front wall disposed on a front side in the stacking direction, a rear wall disposed on a rear side in the stacking direction, and a pair of side walls that connect both ends in a lateral direction, which is normal to the stacking direction, of the front wall and the rear wall.

The case further includes inner walls disposed inside the front wall, the rear wall, and the pair of side walls.

The inner walls include a partition wall that is disposed opposing the front wall, and a support wall that is formed so as to extend toward the rear wall from a rear end surface of the partition wall.

A unit accommodation space for accommodating the semiconductor stacked unit and the pressing member is formed between the partition wall and the front wall.

Auxiliary accommodation spaces for accommodating the auxiliary electronic components are formed between the partition wall and the rear wall.

The electric power converter has the partition wall and the support wall formed so as to extend toward the rear wall from the rear end surface of the partition wall, that is, formed along a pressing direction of the pressing member.

Therefore, by reinforcing the support wall with the partition wall, it is possible to effectively increase the rigidity of the support wall.

Thus, the rigidity of the support wall is improved without increasing the thickness of the partition wall, and it is possible to suppress deformation of the partition wall due to the pressure of the pressing member.

Thereby, the thickness of the partition wall is reduced, and it becomes possible to reduce the weight, the size, and the cost of the electric power converter.

Further, the unit accommodation space for disposing the semiconductor stacked unit and the auxiliary accommodation spaces for disposing the auxiliary electronic components are formed in the case.

Therefore, the semiconductor stacked unit and the auxiliary electronic components can be disposed neatly in the case.

Thereby, the space in the case can be used effectively without waste, and the electric power converter can be miniaturized.

As described above, according to the electric power converter of the present embodiment, the electric power converter is capable of reducing weight, size and cost.

In the electric power converter according to a second aspect, a coolant inlet tube for introducing coolant into a plurality of coolant flow passages formed inside the cooling pipes and a coolant outlet tube for discharging the coolant from the coolant flow passages are disposed so as to extend toward the front side of a front cooling pipe that is disposed on the front side among the plurality of cooling pipes.

The support wall is disposed between the coolant inlet tube and the coolant outlet tube when viewed from the stacking direction and a height direction, which is normal to the lateral direction.

In the electric power converter according to a third aspect, a first auxiliary accommodation space and a second auxiliary accommodation space separated by the support wall are formed as the auxiliary accommodation spaces.

The auxiliary electronic components are respectively accommodated into both the first auxiliary accommodation space and the second auxiliary accommodation space.

In the electric power converter according to a fourth aspect, a terminal block provided with connection terminals connected to external devices is provided at a position where the unit accommodation space and the auxiliary accommodation spaces adjoin in the lateral direction.

The semiconductor modules, the auxiliary electronic components, and the connecting terminals are electrically connected by bus bars.

In the electric power converter mentioned above, the lateral direction is intended to refer to a direction normal to the stacking direction, and to a direction pointing where the pair of the side walls are disposed.

BRIEF DESCRIPTION OF THE DRAWINGS

In the accompanying drawings:

FIG. 3 shows a plan view of a case in the embodiment.

DETAILED DESCRIPTION OF THE PREFERABLE EMBODIMENT

Figure 1:
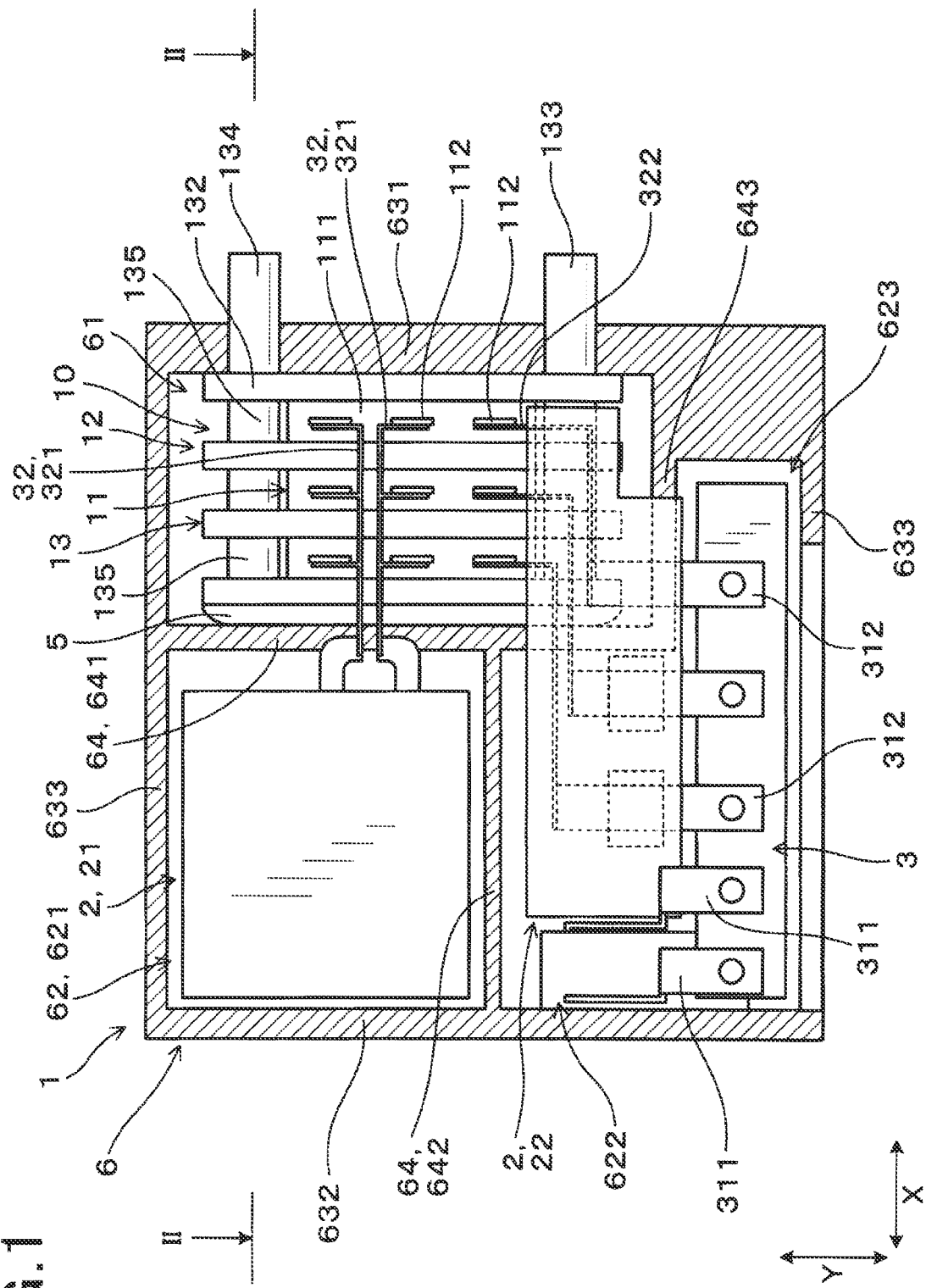
FIG. 1 shows a plan view of an electric power converter in an embodiment.
Figure 2:
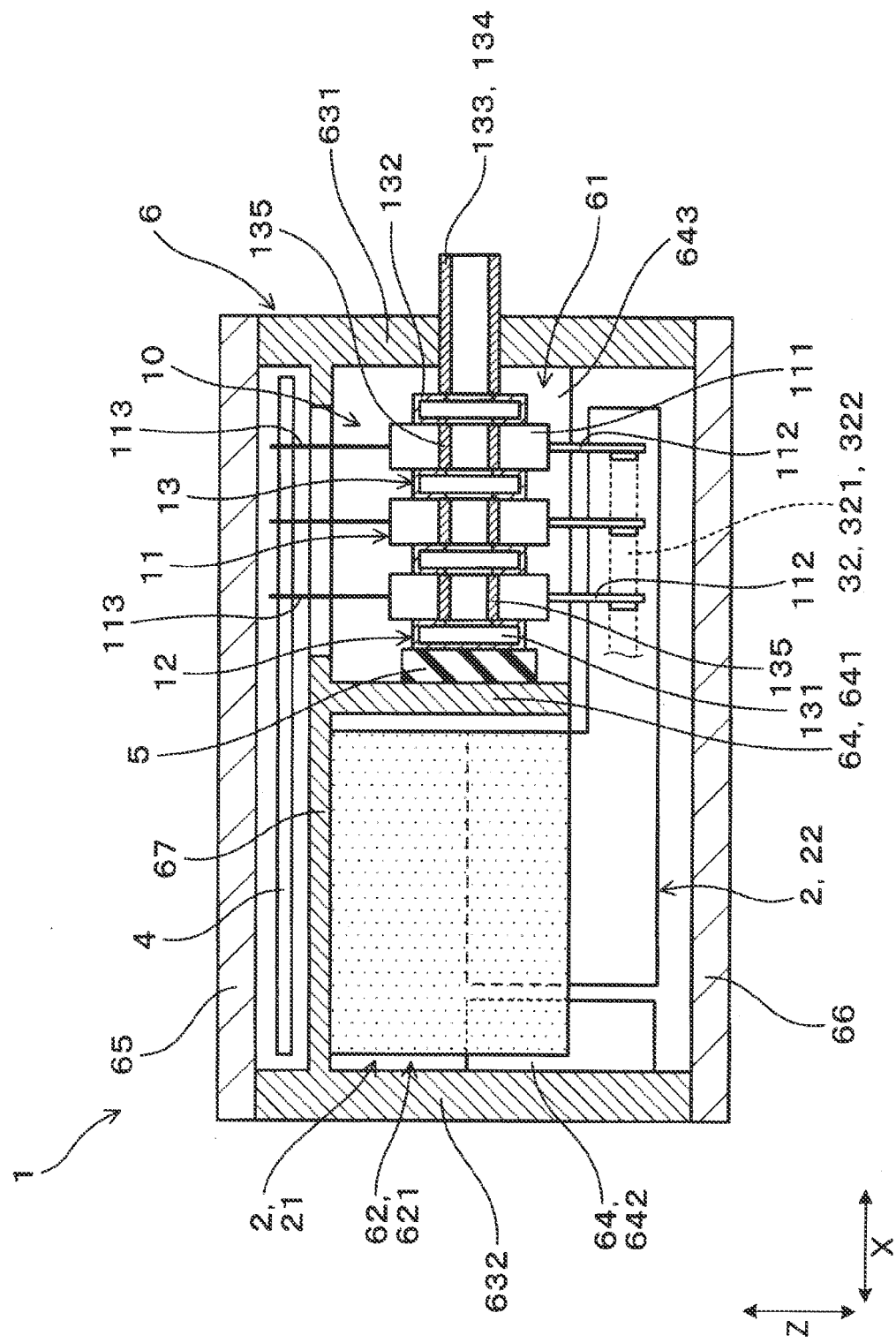
FIG. 2 shows a sectional view taken along a line II-II in FIG. 1.

With reference to FIGS. 1 to 3, hereinafter will be described an embodiment of the present disclosure regarding an electric power converter.

As shown in FIGS. 1 and 2, an electric power converter 1 has a semiconductor stacked unit 10, auxiliary electronic components 2, a pressing member 5, and a case 6 that accommodates these components therein.

The semiconductor stacked unit 10 is formed by stacking alternately a plurality of semiconductor modules 11 and a plurality of cooling pipes 13.

The auxiliary electronic components 2 form a power conversion circuit together with the semiconductor modules 11.

The pressing member 5 presses the semiconductor stacked unit 10 in a stacking direction X of the semiconductor stacked unit 10.

Each of the plurality of semiconductor modules 11 has a built-in semiconductor element therein.

The case 6 has a front wall 631 disposed on a front side in the stacking direction X, a rear wall 632 disposed on a rear side in the stacking direction X, a pair of side walls 633 that connect both ends in a lateral direction Y of the front wall 631 and the rear wall 632, and inner walls 64 disposed inside the front wall 631, rear wall 632 and the pair of side walls 633.

The inner walls 64 include a partition wall 641 that is disposed opposing the front wall 631, and a support wall 642 that is formed so as to extend toward the rear wall 632 from a rear end surface of the partition wall 641.

A unit accommodation space 61 for accommodating the semiconductor stacked unit 10 is formed between the partition wall 641 and the front wall 631.

Further, auxiliary accommodation spaces 62 where the auxiliary electronic components 2 are accommodated are formed between the partition wall 641 and the rear wall 632.

In the present embodiment, a direction of the stacking semiconductor modules 11 and the cooling pipes 13 in the semiconductor stacked unit 10 is defined as the stacking direction X.

Further, a direction normal to the stacking direction X is defined as the lateral direction Y.

Furthermore, a direction normal to the stacking direction X and the lateral direction Y is defined as a height direction Z.

Moreover, in the stacking direction X, a direction in which the coolant inlet tube 133 and the coolant outlet tube 134 protrude from the cooling pipes 13 is defined as a front, and a direction opposite to the front is defined as a rear.

Further, in the height direction Z, a direction in which control terminals 113 protrude from the semiconductor modules 11 is defined as upwards, and a direction opposite to the above is defined as downwards.

The electric power converter 1 in the present embodiment is intended to be mounted on a vehicle such as a hybrid car or the like.

The electric power converter 1 can convert a DC power supplied from a battery (not shown) into three-phase AC power for driving a three-phase AC rotating electric machine (not shown).

As shown in FIGS. 1-3, the case 6 of the electric power converter 1 has the front wall 631 disposed on the front side in the stacking direction X, the rear wall 632 disposed on the rear side, the pair of side walls 633 that connect both ends in the lateral direction Y of the front wall 631 and the rear wall 632, the inner walls 64 disposed inside the front wall 631, rear wall 632 and the pair of side walls 633, and an intermediate wall 67 disposed normal to the height direction Z.

The front wall 631, the rear wall 632, and the pair of side walls 633 form a square-section cylindrical shape.

Further, openings formed upwards and downwards in the height direction Z on the case 6 are closed by a lid 65 and a bottom 66, respectively.

Moreover, the intermediate wall 67 formed normal to the height direction Z is formed in a position upwards side of the front wall 631, the rear wall 632, and the pair of side walls 633.

The inner walls 64 have the partition wall 641 and the support wall 642.

The partition wall 641 extends downwardly from the intermediate wall 67, and is formed parallel to the front wall 631.

In the lateral direction Y, one end of the partition wall 641 is connected with one of the side walls 633, and another end of the partition wall 641 is positioned away from the other one of the side walls 633.

The end of the partition wall 641 positioned away from the side wall 633 and the front wall 631 are connected by a connecting wall 643.

The unit accommodation space 61 for accommodating the semiconductor stacked unit 10 is formed between the front wall 631 and the partition wall 641.

In the present embodiment, the unit accommodation space 61 is formed by a space surrounded by the front wall 631, the partition wall 641, the connecting wall 643, and one of the side walls 633.

Further, the auxiliary accommodation spaces 62 where the auxiliary electronic components 2 are accommodated are formed between the partition wall 641 and the rear wall 632.

The support wall 642 extends downwardly from the intermediate wall 67.

The support wall 642 is formed parallel to the side walls 633 so as to connect a rear surface of the partition wall 641 and a front surface of the rear wall 632.

When viewed from the height direction Z, the support wall 642 is disposed normal to the partition wall 641, and in the lateral direction Y, the support wall 642 is disposed between the coolant inlet tube 133 and the coolant outlet tube 134 of the cooler 12, which will be described later.

The auxiliary accommodation spaces 62 are divided by the support wall 642 in the lateral direction Y to form a first auxiliary accommodation space 621 and a second auxiliary accommodation space 622.

In the present embodiment, a capacitor 21 as an auxiliary electronic component 2 constituting the power conversion circuit together with the semiconductor modules 11 is disposed in the first auxiliary accommodation space 621.

Moreover, a sensor unit 22 with a built-in current sensor (not shown) as another auxiliary electronic component 2 is disposed in the second auxiliary accommodation space 622.

Further, a terminal accommodating space 623 for disposing a terminal block 3 is formed at a position where the unit accommodation space 61 and the auxiliary accommodation spaces 62 adjoin in the lateral direction Y.

The terminal block 3 has connection terminals 312 electrically connected to U-phase, V-phase, and W-phase of the three-phase AC rotating electric machine, and positive and negative electrodes of the battery of the vehicle.

As shown in FIGS. 1 and 2, the semiconductor stacked unit 10 disposed in the unit accommodation space 61 is formed by stacking the plurality of semiconductor modules 11 and the plurality of cooling pipes 13 alternately.

Each of the semiconductor modules 11 includes a main body 111, main electrode terminals 112, and control terminals 113. The main body 111 has a switching element such as an IGBT (insulated gate bipolar transistor) and a diode such as a FWD (freewheeling diode) therein. The main electrode terminals 112 protrude in one of the height directions Z, while the control terminals 113 protrude opposite in height directions Z.

The control terminals 113 are electrically connected to the control circuit board 4.

Further, the main electrode terminals 112 are electrically connected to bus bars 321, 322.

The bus bars 321, 322 connected to the main electrode terminals 112 are connected to the connection terminals 312 provided on the terminal block 3 or the capacitor 21.

The bus bars 321 are connected electrically to the connecting terminals 311 through the capacitor 21. The connecting terminals 311 are connected electrically to the positive electrode and the negative electrode of the battery in the vehicle.

The bus bars 322 are connected to the connection terminals 312 after being inserted through the current sensor built in the sensor unit 22.

As shown in FIGS. 1 and 2, the plurality of cooling pipes 13 is elongated in the lateral direction Y.

The cooling pipes 13 adjacent to each other constitute the cooler 12 by being connected by deformable connecting pipes 135 at both ends thereof in the lateral direction Y.

That is, a space having a length of the connecting pipe 135 is formed between the cooling pipes 13 adjacent to each other, and after placing the semiconductor module 11 in this space, the semiconductor modules 11 is held by the cooling pipes 13 by deforming the connecting pipe 135 so that the length of the connecting pipe 135 is shortened.

The coolant inlet tube 133 for introducing the coolant into the cooler 12 and the coolant outlet tube 134 for discharging the coolant from the cooler 12 are extended towards front from a front cooling pipe 132 that is disposed on the front side.

The coolant inlet tube 133 and the coolant outlet tube 134 are inserted into through holes formed on the front wall 631.

In the cooler 12, the coolant introduced from the coolant inlet tube 133 after flowing into the cooling pipe 13 is distributed to each cooling pipe 13 flowing through the connecting pipes 135 appropriately.

Then, while flowing through each cooling pipe 13, the coolant exchanges heat with the semiconductor modules 11.

The coolant of which the temperature is raised by the heat exchange is led to the coolant outlet tube 134 flowing through the downstream-side connecting pipes 135 appropriately, and is discharged from the cooler 12.

As the coolant, for example, natural coolant such as water or ammonia, water mixed with ethylene glycol-based antifreeze, fluorocarbon-based coolant such as FLUORINERT (registered trademark), other fluorocarbon-based coolant such as HCFC123 or HFC134a, alcohol-based coolant such as methanol or alcohol, or ketone-based coolant such as acetone, may be used.

The pressing member 5 is formed of rubber, and can generate a pressing force by the elastic deformation.

The semiconductor stacked unit 10 is pressed in the stacking direction X by the pressing member 5 by accommodating the pressing member 5 and the semiconductor stacked unit 10 in the unit accommodation space 61.

A leaf spring, a coil spring or the like may be used as a pressing member 5.

Next, functions and effects of the present embodiment are described.

The electric power converter 1 has the partition wall 641 and the support wall 642 formed so as to extend toward the rear wall 632 side from the rear surface of the partition part 641, that is, in the stacking direction X.

By reinforcing the support wall 642 with the partition wall 641, it is possible to increase the rigidity of the support wall 642 effectively.

Thus, the rigidity of the support wall 642 is improved without increasing the thickness of the partition wall 641, and it is possible to suppress deformation of the partition wall 641 due to the pressure of the pressing member 5.

Thereby, the thickness of the partition wall 641 is reduced, and it becomes possible to reduce the weight, the size, and the cost of the electric power converter 1.

In addition, the space inside the case 6 is separated into the unit accommodation space 61 and the auxiliary accommodation spaces 62 by the partition wall 641 and the support wall 642, and the semiconductor stacked unit 10 and the auxiliary electronic component 2 are accommodated respectively in the unit accommodation space 61 and the auxiliary accommodation spaces 62.

Therefore, the semiconductor stacked unit 10 and the auxiliary electronic component 2 can be disposed neatly in the case 6.

Thereby, the space in the case 6 can be used effectively without waste, and the electric power converter 1 can be miniaturized.

Further, the coolant inlet tube 133 for introducing coolant into a plurality of coolant flow passages 131 formed inside the cooling pipes 13 and the coolant outlet tube 134 for discharging the coolant from the coolant flow passages 131 are disposed so as to extend toward the front side on the front cooling pipe 132 that is disposed on the front side among the plurality of cooling pipes 13, and the support wall 642 is disposed between the coolant inlet tube 133 and the coolant outlet tube 134 when viewed from the stacking direction X and the height direction Z.

Thereby, it is possible to dispose the support wall 642 to a position close to a center of the semiconductor stacked unit 10 in an aligning direction of the coolant inlet tube 133 and the coolant outlet tube 134.

Therefore, it is possible to effectively reinforce the partition wall 641 by the support wall 642. This makes it possible to further suppress the deformation of the partition wall 641.

Further, the first auxiliary accommodation space 621 and the second auxiliary accommodation space 622 separated by the support wall 642 are formed as the auxiliary accommodation spaces 62.

In addition, the auxiliary electronic components 2 are respectively accommodated into both the first auxiliary accommodation space 621 and the second auxiliary accommodation space 622.

Therefore, it is possible to dispose the plurality of auxiliary electronic components 2 neatly in the case 6.

Thus, the space inside the case 6 can be used more effectively, and it is possible to reduce the size of the electric power converter 1 even when disposing the plurality of auxiliary electronic components 2 in the case 6.

Moreover, the terminal block 3 provided with the connection terminals 311, 312 connected to external devices is provided at the position where the unit accommodation space 61 and the auxiliary accommodation spaces 62 adjoin in the lateral direction Y.

Further, it is preferable that the semiconductor modules 11, the auxiliary electronic components 2, and the connecting terminals 311, 312 are electrically connected by the bus bars 32.

In this case, the semiconductor module 11, the auxiliary electronic components 2, and the terminal block 3 are accommodated neatly in the case 6, while the semiconductor module 11, the auxiliary electronic components 2, and the connecting terminals 311, 312 can be easily connected by the bus bars 32.

As described above, according to the electric power converter 1 of the present embodiment, the electric power converter 1 is capable of reducing weight, size and cost.

In the above embodiment, one end of the partition wall 641 is connected to the side wall 633, and the other end of the partition wall 641 is connected to the connecting wall 643.

Other than this, the partition wall 641 may be connected to any other walls, or may be spaced apart without being connected to the wall.

Further, one end of the support wall 642 is connected to the partition wall 641, and the other end is connected to the rear wall 632.

When the support wall 642 is formed so as to stand from a member corresponding to the intermediate wall 67, the support wall 642 and the rear wall 632 may be formed apart from each other.

Moreover, when viewed from the height direction Z, it is preferable that the support wall 642 is disposed at a position overlapping with the pressing member 5 in the stacking direction X.

Furthermore, when viewed from the height direction Z, it is more preferable that the support wall 642 is disposed between the coolant inlet tube 133 and the coolant outlet tube 134 in the lateral direction Y.

What is claimed is:
1. An electric power converter comprising:
a semiconductor stacked unit formed by stacking alternately a plurality of semiconductor modules with built-in semiconductor element therein and a plurality of cooling pipes for cooling the plurality of semiconductor module;
auxiliary electronic components that form a power conversion circuit together with the semiconductor modules;
a pressing member that presses the semiconductor stacked unit in a stacking direction; and
a case that accommodates the semiconductor stacked unit, the auxiliary electronic components and the pressing member; wherein,
the case has a front wall disposed on a front side in the stacking direction and a rear wall disposed on a rear side in the stacking direction, a pair of side walls that connect both ends of the case in a lateral direction, which is normal to the stacking direction, of the front wall and the rear wall, and inner walls disposed inside the front wall, the rear wall, and the pair of side walls;
the inner walls include a partition wall that is disposed opposing the front wall, and a support wall that is formed so as to extend toward the rear wall from a rear end surface of the partition wall; wherein,
a unit accommodation space for accommodating the semiconductor stacked unit and the pressing member is formed between the partition wall and the front wall;
auxiliary accommodation spaces for accommodating the auxiliary electronic components are formed between the partition wall and the rear wall; and
the support wall extends toward the rear wall from the rear end surface of the partition wall at an intermediate position of the partition wall that is between the one end of the partition wall and the other end of the partition wall.

2. The electric power converter according to claim 1, wherein,
a coolant inlet tube for introducing coolant into a plurality of coolant flow passages formed inside the cooling pipes and a coolant outlet tube for discharging the coolant from the coolant flow passages are disposed so as to extend toward a front side of a front cooling pipe that is disposed on the front side among the plurality of cooling pipes; and
the support wall is disposed between the coolant inlet tube and the coolant outlet tube when viewed from the stacking direction and a height direction, which is normal to the lateral direction.

3. The electric power converter according to claim 1, wherein,
a first auxiliary accommodation space and a second auxiliary accommodation space separated by the support wall are formed as the auxiliary accommodation spaces; and
the auxiliary electronic components are respectively accommodated into both the first auxiliary accommodation space and the second auxiliary accommodation space.

4. The electric power converter according to claim 2, wherein,
a first auxiliary accommodation space and a second auxiliary accommodation space separated by the support wall are formed as the auxiliary accommodation spaces; and
the auxiliary electronic components are respectively accommodated into both the first auxiliary accommodation space and the second auxiliary accommodation space.

5. The electric power converter according to claim 1, wherein,
a terminal block provided with connection terminals connected to external devices is provided at a position where the unit accommodation space and the auxiliary accommodation spaces adjoin in the lateral direction; and the semiconductor modules, the auxiliary electronic components, and the connecting terminals are electrically connected by bus bars.

6. The electric power converter according to claim 3, wherein:
a capacitor is disposed in the first auxiliary accommodation space; and
a sensor unit is disposed in the second auxiliary accommodation space.

7. The electric power converter according to claim 4, wherein:
a capacitor is disposed in the first auxiliary accommodation space; and
a sensor unit is disposed in the second auxiliary accommodation space.

8. The electric power converter according to claim 1, wherein:
the partition wall extends parallel to the front wall and the rear wall; and
the partition wall is closer to the front wall than to the rear wall.

9. The electric power converter according to claim 1, wherein:
one end of the partition wall is connected to one of the pair of side walls and an other end of the partition wall is positioned away from an other one of the pair of side walls.

10. The electric power converter according to claim 2, wherein:
the support wall is disposed between the coolant inlet tube and the coolant outlet tube and is disposed outside of the unit accommodation space accommodating the semiconductor stacked unit having the plurality of semiconductor modules and the plurality of cooling pipes for cooling the plurality of semiconductor modules.

11. An electric power converter comprising:
a semiconductor stacked unit formed by stacking alternately a plurality of semiconductor modules with built-in semiconductor element therein and a plurality of cooling pipes for cooling the plurality of semiconductor module;
auxiliary electronic components that form a power conversion circuit together with the semiconductor modules;
a pressing member that presses the semiconductor stacked unit in a stacking direction; and
a case that accommodates the semiconductor stacked unit, the auxiliary electronic components and the pressing member; wherein:
the case has a front wall disposed on a front side in the stacking direction and a rear wall disposed on a rear side in the stacking direction, a pair of side walls that connect both ends of the case in a lateral direction, which is normal to the stacking direction, of the front wall and the rear wall, and inner walls disposed inside the front wall, the rear wall, and the pair of side walls;
the inner walls include a partition wall that is disposed opposing the front wall, and a support wall that is formed so as to extend toward the rear wall from a rear end surface of the partition wall;
a unit accommodation space for accommodating the semiconductor stacked unit and the pressing member is formed between the partition wall and the front wall;
auxiliary accommodation spaces for accommodating the auxiliary electronic components are formed between the partition wall and the rear wall;
a coolant inlet tube for introducing coolant into a plurality of coolant flow passages formed inside the cooling pipes and a coolant outlet tube for discharging the coolant from the coolant flow passages are disposed so as to extend toward a front side of a front cooling pipe that is disposed on the front side among the plurality of cooling pipes;
the support wall is disposed between the coolant inlet tube and the coolant outlet tube when viewed from the stacking direction and a height direction, which is normal to the lateral direction; and
the support wall is disposed between the coolant inlet tube and the coolant outlet tube and is disposed outside of the unit accommodation space accommodating the semiconductor stacked unit having the plurality of semiconductor modules and the plurality of cooling pipes for cooling the plurality of semiconductor modules.

* * * * *